April 26, 1960 I. STRAUSS 2,934,098

TOOL FOR PROCESSING ELECTRICAL COMPONENTS

Filed Oct. 15, 1954 3 Sheets-Sheet 1

INVENTOR
Irving Strauss
BY
Munn, Liddy, Nathanson & March
ATTORNEYS

April 26, 1960 I. STRAUSS 2,934,098

TOOL FOR PROCESSING ELECTRICAL COMPONENTS

Filed Oct. 15, 1954 3 Sheets-Sheet 2

INVENTOR

Irving Strauss

BY

Munn, Liddy, Nathanson & March

ATTORNEYS

INVENTOR
Irving Strauss
BY
Munn, Liddy, Nathanson & March
ATTORNEYS

United States Patent Office 2,934,098

Patented Apr. 26, 1960

2,934,098

TOOL FOR PROCESSING ELECTRICAL COMPONENTS

Irving Strauss, Bridgeport, Conn., assignor to Bruno-New York Industries Corporation, New York, N.Y., a corporation of New York Application October 15, 1954, Serial No. 462,557

15 Claims. (Cl. 140—71)

This invention relates to tools adapted to process electrical circuit components, to adapt them mechanically for incorporation into electrical circuit assemblies.

In the fabrication of electronic equipment, small circuit components are utilized, consisting of capacitors, resistors, transistors and the like, said components usually comprising a body portion having bare wire leads extending oppositely therefrom.

Heretofore the usual fabrication procedure has comprised cutting the wire leads to length and bending them, all by hand, to fit the circuit assemblies or chassis of electrical apparatus in which they are to be incorporated. This procedure was not exact or accurate, was time consuming, and did not make for economical manufacture. Also, if through some inadvertence the wire leads were clipped too short or improperly bent, it became necessary to either make further adjustments to adapt the component to the circuit, or else discard the component entirely.

The above drawbacks and disadvantages of this prior procedure are obviated by the present invention, and an object of the invention is to provide an improved apparatus with which various circuit components may be quickly and accurately processed, by the operations of cutting and bending the wire leads thereof, to adapt the components to predetermined circuit assemblies or chassis set-ups.

Another object of the invention is to provide an improved apparatus as above set forth, which is readily adjustable to accommodate different sizes and shapes of body portions of the components, and to enable the remaining portions of the leads after they are cut off to have different predetermined lengths and different angular or other configurations as required by particular circuit assemblies.

A further object of the invention is to provide an improved tool or apparatus in accordance with the foregoing, which may be quickly and easily adjusted to produce the various processed components which are desired, and which does not require any appreciable skill on the part of the operator.

A still further object of the present invention is to provide means for automatically ejecting the component when the bending and cutting operations are completed.

A feature of the invention resides in the provision of an improved component processing apparatus of the above type, which is small and compact, of simple and economical construction, has relatively few operating parts, and is reliable in operation over an extended period of use.

Other features and advantages will hereinafter appear:

Figure 1:
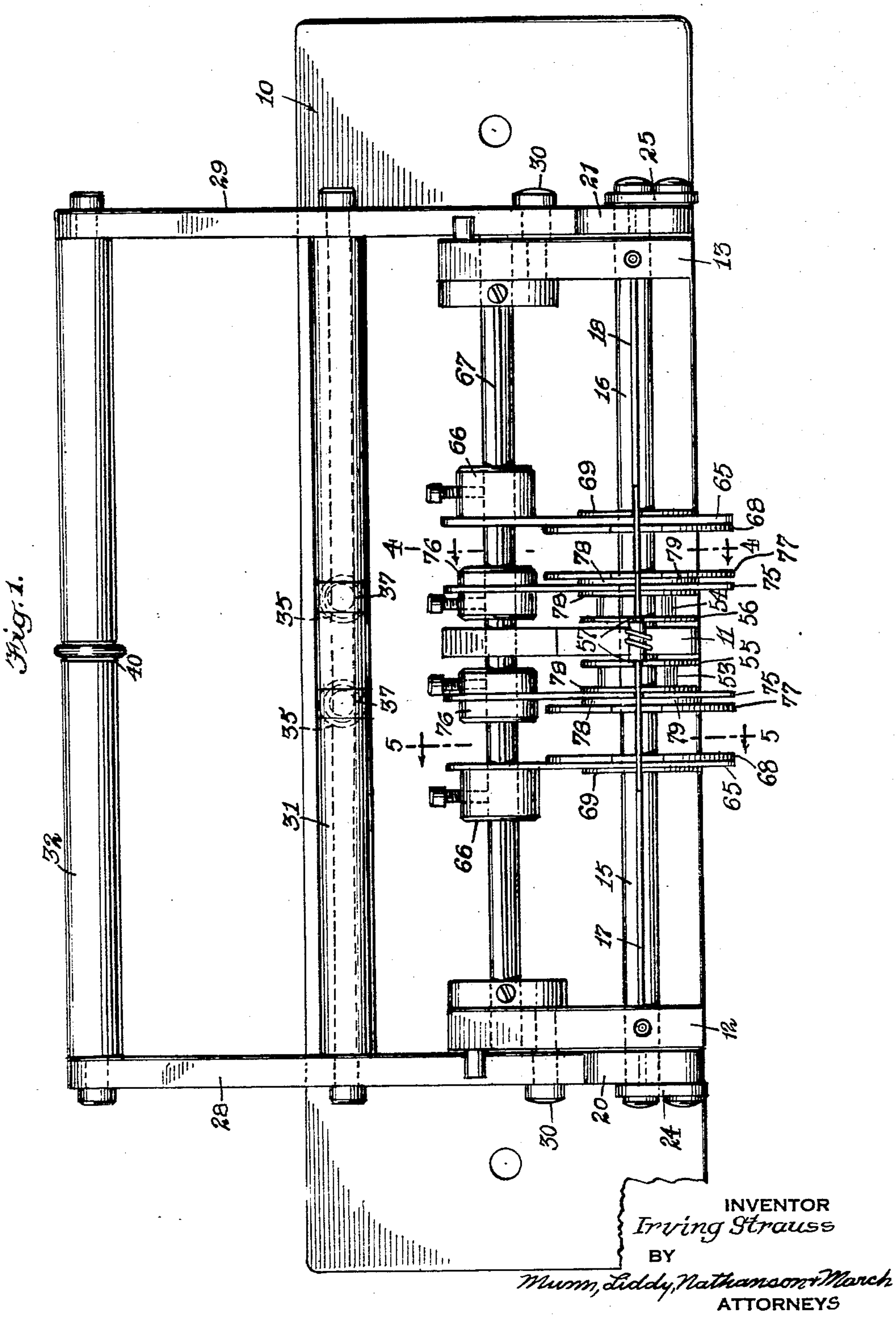
Fig. 1 is a top view of the apparatus of this invention.

As shown, the improved tool or apparatus of the present invention for mechanically processing circuit components comprises a base 10 in the form of a relatively thick, flat plate, having a centrally disposed upright 11 and a pair of end uprights 12 and 13. The uprights 11—13 may be secured to the base in any suitable manner, as for example by countersunk fillister-head screws 14.

Extending inward from and through the end uprights 12 and 13, through the center upright 11, and bearing in all of said uprights are rotatable shafts 15 and 16, having splines 17 and 18.

On the outer or remote ends of the shafts 15 and 16 are affixed crank disks 20 and 21 having eccentrically located crank pins in the form of screws 22 and 23. Pivotally connected to the screws 22 and 23 are short, flat links 24 and 25, which are also pivotally connected to screws 26 and 27 carried on the extremities of levers 28 and 29 which are pivoted by means of pins 30 on the end uprights 12 and 13.

Figures 2, 3, 4:
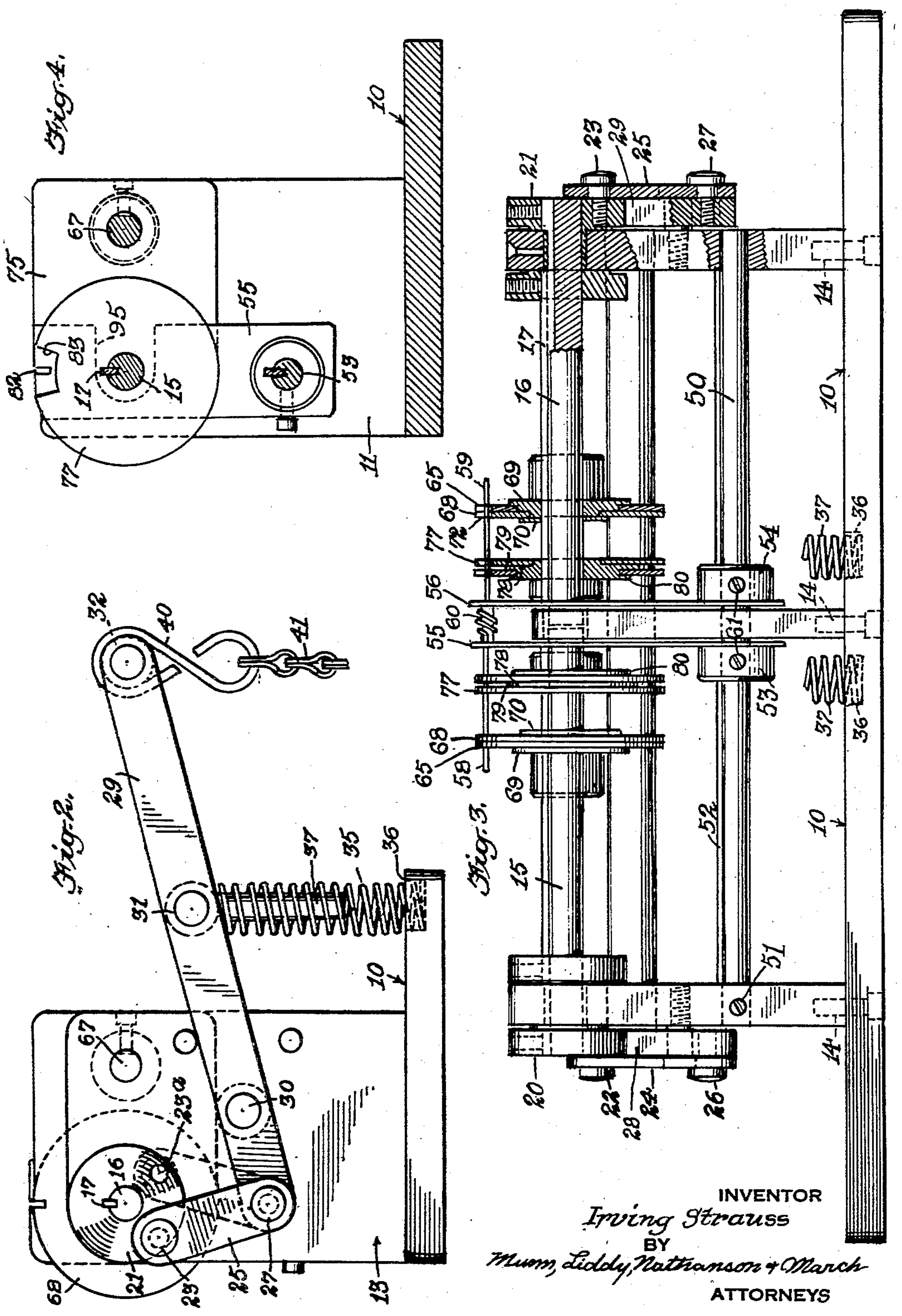
Fig. 2 is a side elevational view of the apparatus.
Fig. 3 is a rear elevation of the apparatus, portions being shown in vertical section to reveal details of construction.
Fig. 4 is a fragmentary transverse vertical section taken on line 4—4 of Fig. 1.

The levers 28 and 29 extend forwardly of the uprights 12 and 13, as shown in Figs. 1 and 2, and are interconnected for simultaneous actuation by a pair of tie rods 31 and 32, the latter being adapted to constitute a handle if it is desired to manually actuate the levers 28 and 29.

The levers 28 and 29 are normally maintained in a predetermined raised position by helical compression springs 35 carried in sockets 36 in the base 10 and extending upward therefrom and around depending fingers 37 secured to the levers.

Foot actuation of the levers 28 and 29 may be accomplished by providing a connector 40 on the center of the handle 32, and a length of chain 41 attached to the connector 40 and extending downward to a suitable pedal (not shown).

With the above construction it will be observed that upward or downward movement of the handle 32 will result in partial turning of the shafts 15 and 16, as effected by the connecting links 24 and 25 and crank wheels 20 and 21.

In accordance with the present invention, I provide a novel, adjustable nest means on the base 10 adjacent the upper portion of the center upright 11, and a novel, adjustable, shearing and bending means actuated by the shafts 15 and 16 whereby electrical circuit components such as capacitors, resistors and the like may be processed by cutting their wire leads to desired lengths and bending said leads to adapt the components to circuit assemblies.

Referring to Figs. 1 and 3, I provide a supporting bar 50 upwardly spaced from and parallel to the base 10, said bar passing through the three uprights 11, 12 and 13 and being securely anchored thereto by set screws 51. The bar 50 has splines 52, and carries collars 53 and 54 which are keyed to the bar by the splines 52 against turning but are longitudinally movable on the bar. Secured to the collars 53 and 54 are upright plates 55 and 56 having notches 57 in their upper edges, disposed opposite each other for accommodating lead wires 58 and 59 of a circuit component 60, as shown in Fig. 3.

It will be seen that the component 60 may be easily and quickly placed in position between the upright plates 55 and 56 and will be positioned by the notches 57 thereof which accommodate the lead wires 58 and 59. The plates 55 and 56 thus constitute a nest adapted to receive the circuit component, and the nest may be made adjustable to receive and hold different sizes and shapes of components by adjusting the collars 53 and 54 either closer to or further from each other. The adjustment of the nest may be fixed by tightening set screws 61 in the collars 53 and 54, as shown.

Also, by the present invention, I provide in conjunction with the nest constituted of the plates 55 and 56 novel shearing and bending means for cutting off to length and for bending the lead wires of circuit components, such as the wires 58 and 59 of the component 60.

Figure 5:
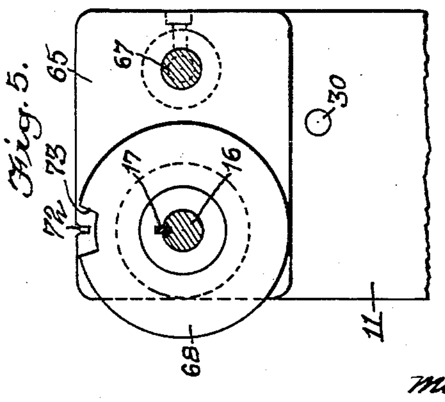
Fig. 5 is a fragmentary transverse vertical section taken on line 5—5 of Fig. 1.

Referring to Figs. 1, 3 and 5, the shearing means comprises stationary shear plates 65 secured to collars 66 which are adjustably carried by a tie bar 67 extending between the end uprights 12 and 13 and passing through the center upright 11. The tie bar 67 is rigidly fastened to the uprights by any suitable means. Cooperable with the stationary shear plates 65 are rotary shear plates 68 which are secured to hubs 69 passing through the stationary plates 65 and held thereto by flanges 70. The hubs 69 receive and are keyed to the shafts 15 and 16, and accordingly when the said shafts are turned the hubs and rotary cutter plates 68 will turn therewith.

As shown in Fig. 5 the stationary shear plates 65 have narrow notches 72, and the rotary shear plates have wider notches 73 adapted to accommodate the lead wires 58 and 59 of the circuit component being processed. When the circuit component is in place on the apparatus, downward movement of the levers 28 and 29 will cause turning of the rotary shear plates 68, thereby to shear off the unwanted ends of the lead wires 58 and 59 of the circuit components. The shearing or cutting means is adjustable to change the amount or length of wire lead which is sheared off, since the hubs 69 are movable axially on the shafts 15 and 16, and since the collars 66 may be adjustably positioned on the tie bar 67 and affixed thereto by the set screws shown.

Also, in accordance with this invention I provide a novel bending means by which the remaining portions of the wire leads after the shearing has occurred may be bent to mechanically adapt the component to its circuit assembly.

Referring to Figs. 1, 3 and 4 the bending means comprises stationary bending members 75 carried by collars 76 which are mounted on and adjustable along the tie bar 67. Cooperable with the stationary bending members 75 are movable bending members 77 carried on hubs 78 and spaced from the stationary members by spacer washers 79. The hubs 78 have flanges 80 by which they are held in operative position within the stationary members 75, and said hubs receive and are keyed to the shafts 15 and 16 for turning movement therewith.

Referring to Fig. 4 the stationary members 75 have narrow notches 82 and the rotary members 77 have wider notches 83 adapted to receive the wire leads of the circuit components. The notches 83 may have greater included angles than the notches 73 of the movable shear plates 68. For example, the included angles of the notches 83 may be 32 degrees and the included angles of the notches 73 may be 24 degrees.

By this organization the shearing of the wire leads will occur prior to, and preferably just ahead of the bending of the remaining portions of the wire leads. It will be readily understood from the above construction that as the handle 32 of the tool is moved downward to bring down the levers 28 and 29, the turning movements imparted to the shearing members 68 and the bending members 77 by the shafts 15 and 16 will first cause the wire leads 58 and 59 to be cut off to desired lengths and thereafter cause the remaining portions of the leads to be bent at right angles.

By the present invention the bending of the wire lead 58 may be made opposite in direction to the bending of the wire lead 59. I accomplish this by the provision of additional threaded holes **23*a* in the crank wheels 20 and 21, which are adapted to alternatively accommodate the crank pins or screws 23. By shifting one or the other of the crank pins to the alternative holes in the crank wheels, opposite turning of the shafts 15 and 16 may be effected, thus causing opposite turning movements of the movable shearing and bending members. Regardless of the direction of turning of the shear members, the wires 58 and 59 will be cut off. However, opposite turning of the bending members 77** will result in opposite bends being formed in the remaining portions of the wire leads.

It will be understood that by shifting the collars 66 and 76 to different positions on the tie bar 67 adjustment may be had of the length and positions of bends of the leads 58 and 59. For example, the lead 58 may be cut long and have a short bend closely adjacent its end, while the lead 59 may be cut fairly short and be bent intermediate its ends. Various combinations of cuts and bends may be readily effected with the apparatus of this invention, since each shearing means and each bending means is adjustable independently of the others. The plates 55 and 56 are also longitudinally adjustable along the bar 50 by means of the collars 53 and 54 for positioning the component as desired.

Figure 7:
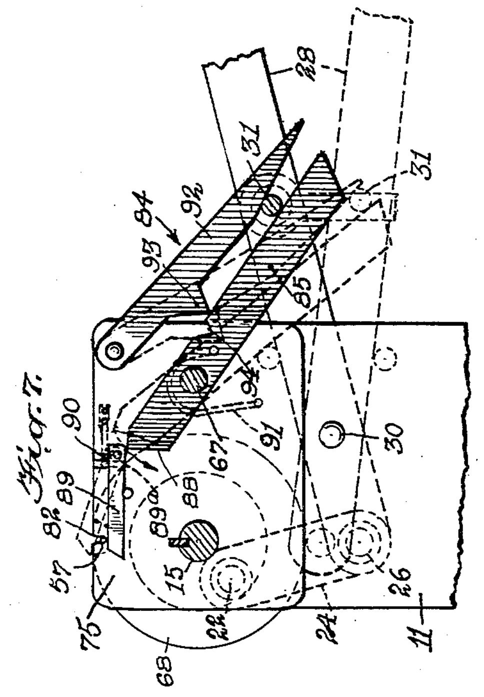
Fig. 7 is a sectionnal view of the ejection means of the apparatus of the present invention.
Figure 6:
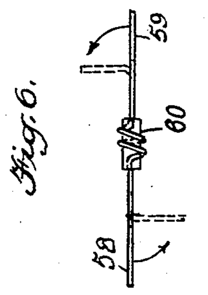
Fig. 6 is a detailed view of the component after the bending and cutting operation.

According to the present invention, I have also provided means for automatically ejecting the component 98 from the machine when the bending and cutting operation hereinbefore described has been completed. Referring particularly to Figs. 1 and 7, ejection means 84 are provided comprising the main driving levers 28 and 29 carrying the tie rod 31. Two actuating bars 85 respectively are pivotally mounted on the stationary bending members 75 and are adapted to be moved in response to return movement of the main driving levers. Disposed adjacent the triangular shaped ends 88 of the actuating bars 85 are ejector bars 89 which are disposed between the stationary bending members 75 and the movable bending members 77. The thickness of the ejector bars is preferably less than the distance between the stationary and movable bending members so as to permit free movement of the ejector bars. It is to be noted that the ejector bars 89 are loosely pivotally mounted on the stationary bending members 75 by means of elongated holes **89*a* in said bars. Hold-down springs 90 are also provided, operable on the ejector bars 89 for holding the latter in down position. Wire coil springs 91 are fastened to the stationary bending members 75 and to the actuating bars 85 bending to turn said bars counterclockwise. To hold the actuating bar in a cocked or charged position, trigger means in the form of locking pawls 92 are provided pivotally mounted on the stationary bending members 75 and having projections 93 engageable in notches 94 in the actuating bars 85. In the drawing the parts of the ejection means 84 hereinbefore described are normally disposed in cocked position, as shown in solid lines. In operation, the main driving levers are raised upon completion of the bending and cutting operations hereinbefore described, said movement being accompanied by upward movement of the tie rod 31. This movement of the tie rod causes movement of the locking pawls 92 whereupon they release the actuating bars for counterclockwise movement by the springs 91. The triangular shaped ends 88 of the actuating bars encounter corners of the ejector bars 89 causing the ejector bars to be raised throwing the wire leads of the components out of the notches 82 and 83 and carrying with them the electrical component. The ejector bars are so constructed as to carry the wires upward along the inclined plane of one end of the ejector bar to a point where the wires are completely out of the notches whereupon gravity will accomplish the remaining removal. The ejectors are adjustable along with the adjustment of the stationary bending plate wherever desired as they are carried by the stationary bending plate. It will be understood that, if desired, under certain conditions the plates 55 and 56 may be tilted forward out of alignment with the cutting and bending members by means of the slots 95**.

While the invention has been described in connection specifically with the processing of electrical circuit components, it will be understood that it may be utilized on any circuit component wherein the bending and cutting of wires is desired.

The apparatus of this invention is seen to be small and compact, easily and quickly adjustable to differently mechanically process various sizes and shapes of circuit components. I have found the apparatus to be effective and reliable in operation, and to require a minimum of skill on the part of the operator.

Variations and modifications may be made within the scope of the claims and portions of the improvements may be used without others.

I claim:

1. Apparatus for cutting to length and bending the wire leads of electrical circuit components of the type having bare wire leads extending oppositely from a body portion, comprising a base; means on the base, for receiving and holding said components with the leads thereof projecting from said means; a shaft mounted on said base; means including movable and stationary members carried by said shaft, and including full bearings for said members, wholly carried by said shaft for simultaneously cutting off end portions of the leads whereby other portions of predetermined lengths remain; and means including other movable and stationary members carried by said shaft, and including full bearings for said members, wholly carried by said shaft for simultaneously bending said remaining lead portions; and anchorage means on said base and separate from said shaft, to which all of said stationary members are secured.

2. The invention as defined in claim 1 in which the means for cutting, and the means for bending are interconnected for simultaneous operation, the cutting of the leads occurring just prior to the bending thereof.

3. The invention as defined in claim 2 in which the shaft has two relatively movable, aligned portions having one pair of ends juxtaposed, in which the movable members of the cutting means are driven by said shaft portions, in which the movable members of the bending means are driven by said shaft portions, and in which there are means for causing simultaneous turning of said shaft portions either in the same direction or in opposite directions.

4. The invention as defined in claim 3 in which the means causing simultaneous turning of the shaft portions comprises cranks connected to said portions, links connected to said cranks, and actuating means for said links.

5. The invention as defined in claim 4 in which one of the shaft portions has opposite cranks either of which is connectable to the driving link for causing either forward or reverse turning of said one shaft portion.

6. The invention as defined in claim 2 in which the bending means cause one of said remaining lead portions to be bent oppositely to the other.

7. The invention as defined in claim 1 in which the means for bending the remaining lead portions is capable of an alternative operation by which the bend in one lead portion may be made opposite to the bend in the other lead portion.

8. The invention as defined in claim 7 in which the means for bending the lead portions comprises a pair of independently turnable crank wheels and links pivotally connected thereto, and in which there is means enabling the pivotal connections of the links to the crank wheels to be changed to cause opposite rotation of the wheels without changing the direction of operating movement of the links.

9. The invention as defined in claim 8 in which the crank wheels are carried by aligned separate portions of the shaft, having juxtaposed ends, and in which the movable bending members are secured to said shaft portions to turn therewith.

10. The invention as defined in claim 1 in which the bending means causes one of said remaining lead portions to be bent oppositely to the other.

11. The invention as defined in claim 1 in which the movable and stationary members of the cutting means are permanently assembled to each other and constituting distinct, unitary, operative entities adapted to withstand stresses on them which are directed longitudinally of the leads, incident to the shearing operation.

12. The invention as defined in claim 1 in which there is means on said base for ejecting the circuit component from the holding means after the cutting and bending of the leads of said component.

13. The invention as defined in claim 12 in which said ejecting means comprise movable ejection members engageable with the wire leads; and spring charged operating means for said ejectors.

14. The invention as defined in claim 13 in which said ejecting means comprise movable ejection members engageable with the wire leads, spring charged operating means for said ejectors, and trigger means for automatically releasing said spring charged means after the cutting and bending of the wire leads.

15. Apparatus for bending the wire leads of electrical circuit components of the type having bare wire leads extending oppositely from a body portion, comprising a base; means on the base for receiving and holding said components with the leads thereof projecting from said means; means on said base for bending said remaining lead portions, said bending means including movable and stationary bending members; means on said base for ejecting the circuit component from the holding means after the bending of the leads of said components, said ejection means comprising movable ejection members engageable with the wire leads; spring charged operating means separate from and engageable with said ejection members to drive the same; and trigger means separate from said ejection members for latching said operating means in cocked position and for automatically releasing said spring charged operating means after the bending of the wire leads, said ejection members, spring charged operating means and trigger means being mounted on said stationary bending member.

References Cited in the file of this patent

UNITED STATES PATENTS

| | | |
|---|---|---|
| 194,409 | Braun | Apr. 21, 1877 |
| 349,946 | McPherson | Sept. 28, 1886 |
| 540,513 | Polyblank | June 4, 1895 |
| 986,713 | Hoover | Mar. 14, 1911 |
| 1,224,075 | Crofoot | Apr. 24, 1917 |
| 1,282,530 | Bloemker | Oct. 22, 1918 |
| 1,394,796 | Smith | Oct. 25, 1921 |
| 1,862,717 | Sorrick | June 14, 1932 |
| 2,450,920 | Shand | Oct. 12, 1948 |
| 2,713,362 | Stahl | July 19, 1955 |
| 2,777,477 | Zimmerman | Jan. 15, 1957 |